United States Patent
Wu et al.

(10) Patent No.: US 10,614,908 B2
(45) Date of Patent: Apr. 7, 2020

(54) METHOD FOR FIXING OUTLIER BIT AND MEMORY DEVICE

(71) Applicant: Winbond Electronics Corp., Taichung (TW)

(72) Inventors: Shang-Rong Wu, Taichung (TW); Shang-Wen Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/293,763

(22) Filed: Mar. 6, 2019

(65) Prior Publication Data
US 2019/0348142 A1   Nov. 14, 2019

(30) Foreign Application Priority Data
May 11, 2018   (TW) .............................. 107116121 A (51) Int. Cl.
*G11C 29/00*   (2006.01)
*G11C 29/50*   (2006.01)
*G11C 7/00*   (2006.01)

(52) U.S. Cl.
CPC .......... *G11C 29/50004* (2013.01); *G11C 7/00* (2013.01)

(58) Field of Classification Search
CPC ............................ G11C 29/50004; G11C 7/00
USPC .......................................................... 365/200
See application file for complete search history.

(56) References Cited

U.S. PATENT DOCUMENTS

| | | | | |
|---|---|---|---|---|
| 7,656,710 B1 * | 2/2010 | Wong | ................. | G11C 16/3454 |
| | | | | 365/185.19 |
| 2009/0129157 A1 * | 5/2009 | Honda | ................ | G11C 11/5628 |
| | | | | 365/185.03 |

* cited by examiner

*Primary Examiner* — Vu A Le
(74) *Attorney, Agent, or Firm* — Muncy, Geissler, Olds & Lowe, P.C.

(57) ABSTRACT

A method for fixing outlier bits is provided in the invention. The method is applied to a memory device, and a memory array of the memory device is divided into a plurality of blocks. The method includes the steps of setting an initial voltage and a terminal voltage of a margin read (MGRD) operation in each block, wherein the initial voltage is set in a distribution of a threshold voltage of each block; finding a MGRD spec corresponding to each block at a range defined by the initial voltage and the terminal voltage; detecting outlier bits in each block according to the MGRD spec corresponding to each block; and fixing the outlier bits in each block.

10 Claims, 6 Drawing Sheets

METHOD FOR FIXING OUTLIER BIT AND MEMORY DEVICE

CROSS REFERENCE TO RELATED APPLICATIONS

This application claims priority of TW Patent Application No. 107116121 filed on May 11, 2018, the entirety of which is incorporated by reference herein.

BACKGROUND OF THE INVENTION

Field of the Invention

The invention relates in general to technology for fixing outlier bits, and in particular to technology for fixing outlier bits by dividing the memory array into a plurality of blocks to perform margin read (MGRD) operations.

Description of the Related Art

Using traditional methods, serious outlier bits can be scanned in a single margin read (MGRD) operation. However, it cannot be guaranteed that erase (ERS) and program (PGM) efficiency in each cell are the same when the memory is manufactured, because the variety of the cell is increased when the cell is scaled. Therefore, the outlier bits in the main group corresponding to the distribution of the threshold voltage cannot be scanned, i.e. the recessive outlier.

In a traditional MGRD operation, only one single condition may be set (i.e. a single MGRD spec). Therefore, in a traditional MGRD operation, normal bits may be filtered because the MGRD spec is too small, and the outlier bit may not be scanned because the MGRD spec is too big. Therefore, as the size of memory becomes smaller, the traditional MGRD operation is not able to resolve the increasingly serious problem of the outlier.

BRIEF SUMMARY OF THE INVENTION

The invention provides a technology for the fixing outlier bit, and more particularly, to the memory device and the method for fixing the outlier bit by dividing the memory array into a plurality of blocks to perform margin read (MGRD) operation to overcome the problems described above.

An embodiment of the invention provides a method for fixing outlier bits. The method is applied to a memory device, and a memory array of the memory device is divided into a plurality of blocks. The method comprises the steps of setting an initial voltage and a terminal voltage of a margin read (MGRD) operation in each block, wherein the initial voltage is set in a distribution of a threshold voltage of each block; finding a MGRD spec corresponding to each block at a range defined by the initial voltage and the terminal voltage; detecting outlier bits in each block according to the MGRD spec corresponding to each block; and fixing the outlier bits in each block.

An embodiment of the invention provides a memory device. The memory device comprises a memory array, a storage circuit and a control circuit. The memory array comprises a plurality of memory cells and divided into a plurality of blocks. An initial voltage and a terminal voltage of a margin read (MGRD) operation are set in each block and the initial voltage is set in a distribution of a threshold voltage of each block. The control circuit is coupled to the memory array and the storage circuit. In addition, the control circuit finds a MGRD spec corresponding to each block at a range defined by the initial voltage and the terminal voltage, detects outlier bits in each block according to the MGRD spec corresponding to each block, and fixes the outlier bits in each block.

BRIEF DESCRIPTION OF THE DRAWINGS

The invention will become more fully understood by referring to the following detailed description with reference to the accompanying drawings, wherein.

DETAILED DESCRIPTION OF THE INVENTION

Figure 1:
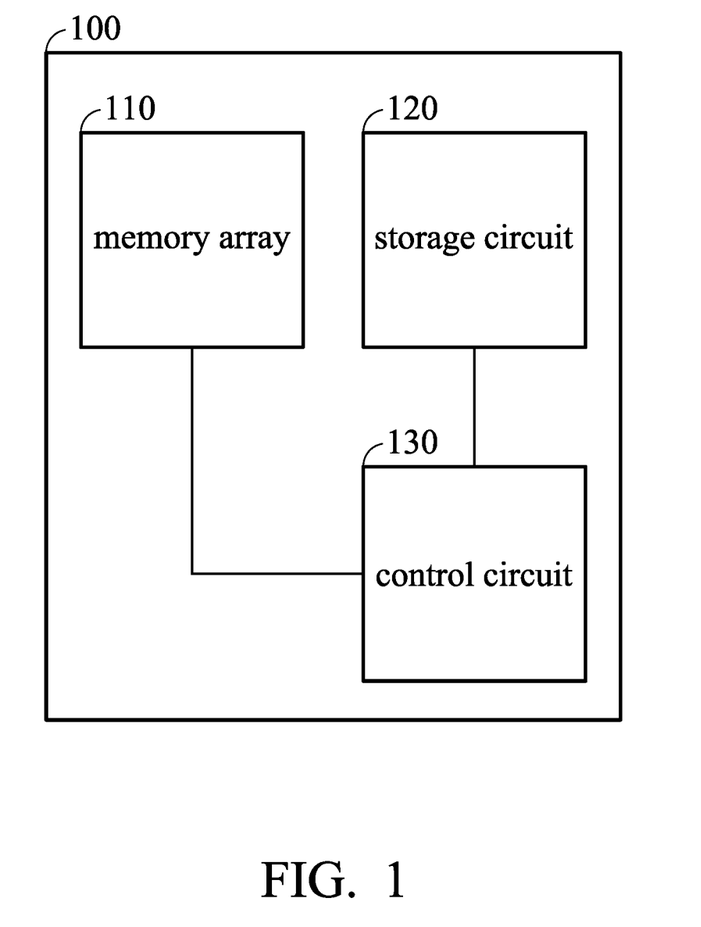
FIG. 1 is a block diagram of a memory device 100 according to an embodiment of the invention.

FIG. 1 is a block diagram of a memory device 100 according to an embodiment of the invention. In some embodiments of the invention, the memory device 100 may be a volatile memory device, such as a dynamic random access memory (DRAM), but the invention should not be limited thereto. In some embodiments of the invention, the memory device 100 may be a non-volatile memory device, such as a read only memory (ROM) or a flash memory, but the invention should not be limited thereto. As shown in FIG. 1 the memory device 100 may comprise a memory array 110, a storage circuit 120 and a control circuit 130. Note that, in order to clarify the concept of the invention, FIG. 1 presents a simplified block diagram in which only the elements relevant to the invention are shown. However, the invention should not be limited to what is shown in FIG. 1. The memory device 100 may comprise other elements.

In an embodiment of the invention, the memory array 110 may comprise a plurality of memory cells, and the memory array 110 may be divided into a plurality of blocks (i.e. each block may comprise a plurality of memory cells). In each block of the memory array 110, an initial voltage and a terminal voltage for the margin read (MGRD) operation are set. In an embodiment of the invention, the initial voltage may be set to a value which is in a distribution of a threshold voltage (Vt) corresponding to each block. That is to say, the initial voltage may be set to any one voltage value in the main group of the distribution of the threshold voltage. In an embodiment of the invention, the range (i.e. the biggest scan range when the control circuit 130 is scanning a block) between the initial voltage and the terminal voltage is decided by engineering analysis.

Figure 2:
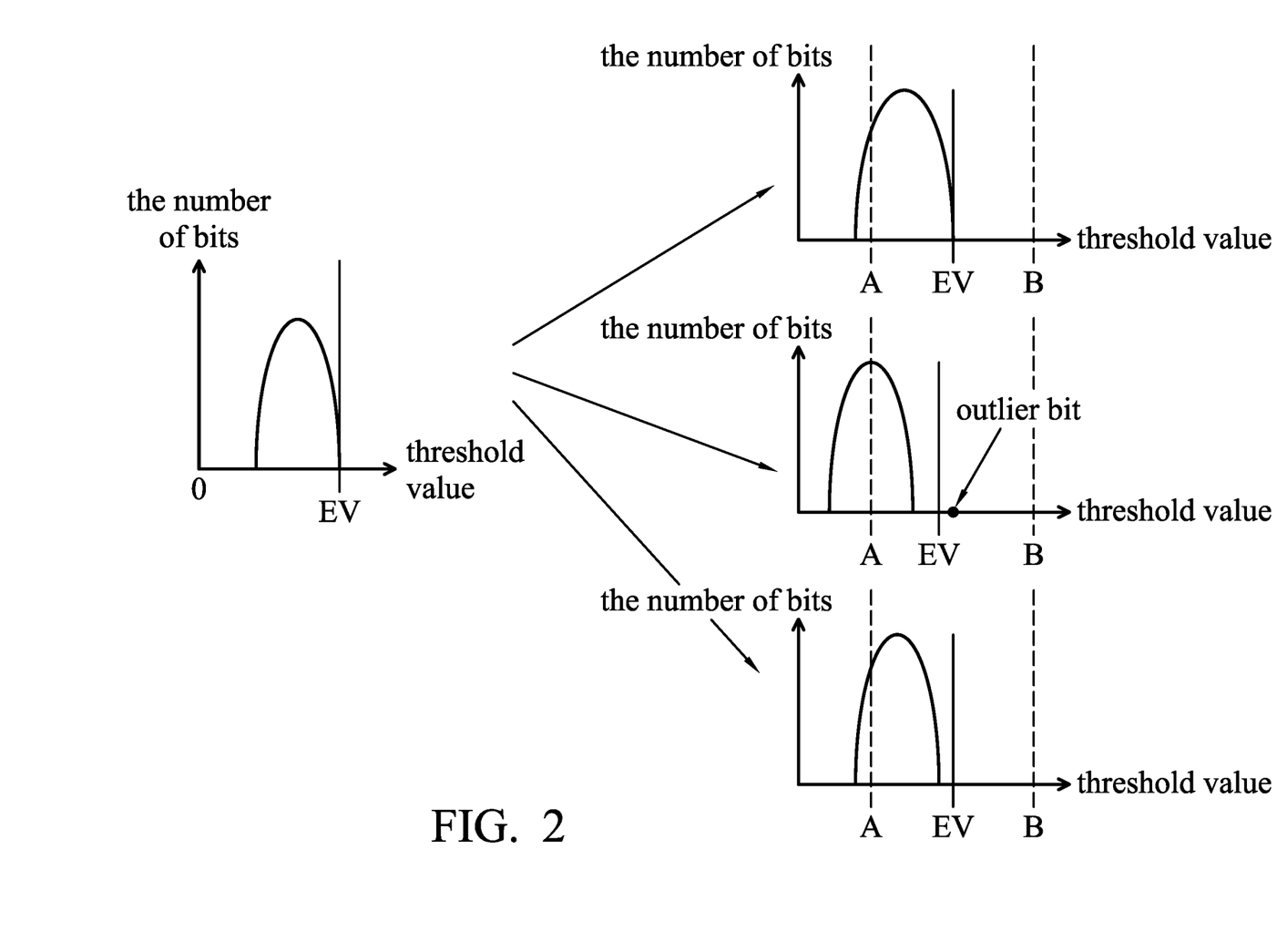
FIG. 2 is a schematic diagram of the distribution of the threshold voltage in a first state (e.g. the erase state) according to an embodiment of the invention.

FIG. 2 is a schematic diagram of the distribution of the threshold voltage in a first state (e.g. the erase state) according to an embodiment of the invention. As shown in FIG. 2, if the memory array 110 is divided into three blocks, according to the embodiment of the invention, in the first state, the distribution diagram of the threshold voltage corresponding to the memory array 110 may be transformed into the distribution diagrams of the threshold voltage respectively corresponding to the three blocks. The A and B shown in FIG. 2 refer to the initial voltage and the terminal voltage, respectively. As shown in FIG. 2, in a traditional MGRD operation, there is only one MGRD spec EV in a memory array. However, in the embodiments of the invention, each block may have its MGRD spec EV. The control circuit 130 may scan the outlier bits according to the MGRD spec EV of each block and fix the outlier bits.

Figure 3:
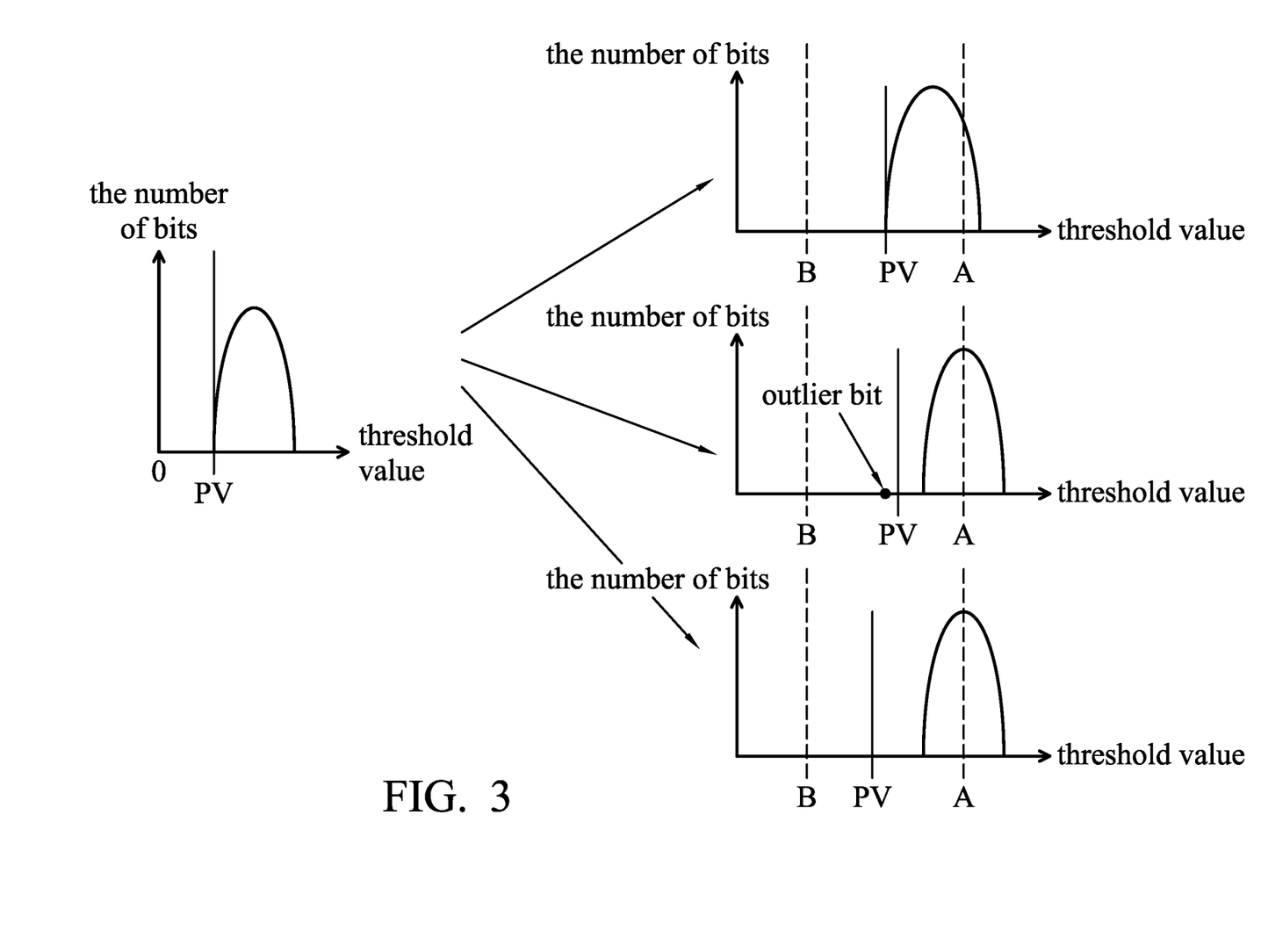
FIG. 3 is a schematic diagram of the distribution of the threshold voltage in a second state (e.g. the program state) according to an embodiment of the invention.

FIG. 3 is a schematic diagram of the distribution of the threshold voltage in a second state (e.g. the program state) according to an embodiment of the invention. As shown in FIG. 3, if the memory array 110 is divided into three blocks, according to the embodiment of the invention, in the first state, the distribution diagram of the threshold voltage corresponding to the memory array 110 may be transformed into the distribution diagrams of the threshold voltage respectively corresponding to the three blocks. The A and B shown in FIG. 3 refer to the initial voltage and the terminal voltage. As shown in FIG. 3, in traditional MGRD operations, there is only one MGRD spec PV in a memory array. However, in the embodiments of the invention, each block may have its MGRD spec PV. The control circuit 130 may scan the outlier bits according to the MGRD spec PV of each block and fix the outlier bits.

According to an embodiment of the invention, the control circuit 130 may be coupled to the memory array 110 and the storage circuit 120. The control circuit 130 may scan each block at the range defined by the initial voltage and the terminal voltage to obtain the MGRD spec corresponding to each block of the memory array 110. After the control circuit 130 obtains the MGRD spec of each block of the memory array 110, the control circuit 130 may scan the outlier bits in each block according to the MGRD spec of each block, and fix the outlier bits in each block.

According to an embodiment of the invention, when the memory device 100 performs the MGRD operation in the first state, the control circuit 130 may scan the first fail bits in the first block of a plurality of blocks at the initial voltage, and the control circuit 130 may store the scanned first fail bits in a first register (not shown in figures) of the storage circuit 120. In addition, the control circuit 130 may scan the second fail bits in the first block of a plurality of blocks at the second voltage, and the control circuit 130 may store the scanned second fail bits in a second register (not shown in figures) of the storage circuit 120. Then, the control circuit 130 may determine whether the number of first fail bits is the same as the number of second fail bits. In the embodiment of the invention, the second voltage may be the initial voltage plus a default voltage (e.g. 0.2V, but the invention should not be limited thereto), and the second voltage is lower than the terminal voltage.

In the embodiment of the invention, when the number of first fail bits is the same as the number of second fail bits, the control circuit 130 may determine that the second voltage is the MGRD spec corresponding to the first block, and the control circuit 130 may find the MGRD spec of the next block (e.g. the second block). When the number of first fail bits is not the same as the number of second fail bits, the control circuit 130 may scan the third fail bits in the first block at a third voltage, and the control circuit 130 may store the scanned third fail bits in a third register (not shown in figures) of the storage circuit 120. In the embodiment of the invention, the third voltage may be the second voltage plus the default voltage (e.g. 0.2V, but the invention should not be limited thereto), and the third voltage is lower than the terminal voltage. Accordingly, the control circuit 130 may stop scanning another fail bit of the first block until it finds the MGRD spec of the first block. However, if at the terminal voltage, the control circuit 130 still cannot find the MGRD spec of the first block, the control circuit may start to find the MGRD of the next block (e.g. the second block). Therefore, when the memory device 100 is in the first state, the control circuit 130 may detect the outlier bits of each block according to the MGRD spec of each block and fix the outlier bits of each block.

For example, it is assumed that in the first state, the scanning range for the MGRD operation of the memory device 100 is from 4V to 6V (i.e. the initial voltage is 4V and the terminal voltage is 6V), and the default voltage is 0.2V. First, the control circuit 130 may start to scan the fail bits from the first block. The control circuit 130 may scan and store the fail bits of the first block at a voltage of 4V, and scan and store the fail bits of the first block at a voltage of 4.2V. Then, the control circuit 130 may determine whether the number of fail bits at a voltage of 4V is the same as the number of fail bits at a voltage of 4.2V. When the number of fail bits at a voltage of 4V is the same as the number of fail bits at a voltage of 4.2V, the control circuit 130 may determine that a voltage of 4.2V is the MGRD spec of the first block. The control circuit 130 may detect the outlier bits of the first block according to the MGRD spec, and fix the outlier bits of the first block. When the number of fail bits at a voltage of 4V is not the same as the number of fail bits at a voltage of 4.2V, the control circuit 130 may scan and store the fail bits of the first block at a voltage of 4.4V and the control circuit 130 may determine whether the number of fail bits at a voltage of 4.2V is the same as the number of fail bits at a voltage of 4.4V. Accordingly, the control circuit 130 may stop scanning another fail bit of the first block until it finds the MGRD spec of the first block. However, if at a voltage of 6V, the control circuit 130 still cannot find the MGRD spec of the first block, the control circuit may start to find the MGRD of the next block.

According to another embodiment of the invention, when the memory device 100 performs the MGRD operation in the second state, the control circuit 130 may scan the first fail bits in the first block of a plurality of blocks at the initial voltage, and the control circuit 130 may store the scanned first fail bits in a first register (not shown in figures) of the storage circuit 120. In addition, the control circuit 130 may scan the second fail bits in the first block of a plurality of blocks at the second voltage, and the control circuit 130 may store the scanned second fail bits in a second register (not shown in figures) of the storage circuit 120. Then, the control circuit 130 may determine whether the number of first fail bits is the same as the number of second fail bits. In the embodiment of the invention, the second voltage may be the initial voltage minus a default voltage (e.g. 0.2V, but the invention should not be limited thereto), and the second voltage is higher than the terminal voltage.

In the embodiment of the invention, when the number of first fail bits is the same as the number of second fail bits, the control circuit 130 may determine that the second voltage is the MGRD spec corresponding to the first block, and the control circuit 130 may find the MGRD spec of the next block (e.g. the second block). When the number of first fail bits is not the same as the number of second fail bits, the control circuit 130 may scan the third fail bits in the first block at a third voltage, and the control circuit 130 may store the scanned third fail bits in a third register (not shown in figures) of the storage circuit 120. In the embodiment of the invention, the third voltage may be the second voltage minus the default voltage (e.g. 0.2V, but the invention should not be limited thereto), and the third voltage is greater than the terminal voltage. Accordingly, the control circuit 130 may stop scanning another fail bit of the first block until it finds the MGRD spec of the first block. However, if at the terminal voltage the control circuit 130 still cannot find the MGRD spec of the first block, the control circuit may start to look for the MGRD of the next block (e.g. the second block). Therefore, when the memory device 100 in the first state, the control circuit 130 may detect the outlier bits of each block according to the MGRD spec of each block and fix the outlier bits of each block.

For example, it is assumed that in the second stage, the scanning range for the MGRD operation of the memory device 100 is from 7V to 5V (i.e. the initial voltage is 7V and the terminal voltage is 5V), and the default voltage is 0.2V. First, the control circuit 130 may start to scan the fail bits from the first block. The control circuit 130 may scan and store the fail bits of the first block at a voltage of 7V, and scan and store the fail bits of the first block at a voltage of 6.8V. Then, the control circuit 130 may determine whether the number of fail bits at a voltage of 7V is the same as the number of fail bits at a voltage of 6.8V. When the number of fail bits at a voltage of 7V is the same as the number of fail bits at a voltage of 6.8V, the control circuit 130 may determine that a voltage of 6.8V is the MGRD spec of the first block. The control circuit 130 may detect the outlier bits of the first block according to the MGRD spec, and fix the outlier bits of the first block. When the number of fail bits at a voltage of 7V is not the same as the number of fail bits at a voltage of 6.8V, the control circuit 130 may scan and store the fail bits of the first block at a voltage of 6.6V and the control circuit 130 may determine whether the number of fail bits at a voltage of 6.8V is the same as the number of fail bits at a voltage of 6.6V. Accordingly, the control circuit 130 may stop scanning another fail bit of the first block until it finds the MGRD spec of the first block. However, if at a voltage of 5V the control circuit 130 still cannot find the MGRD spec of the first block, the control circuit may start to find the MGRD of the next block.

Figure 4:
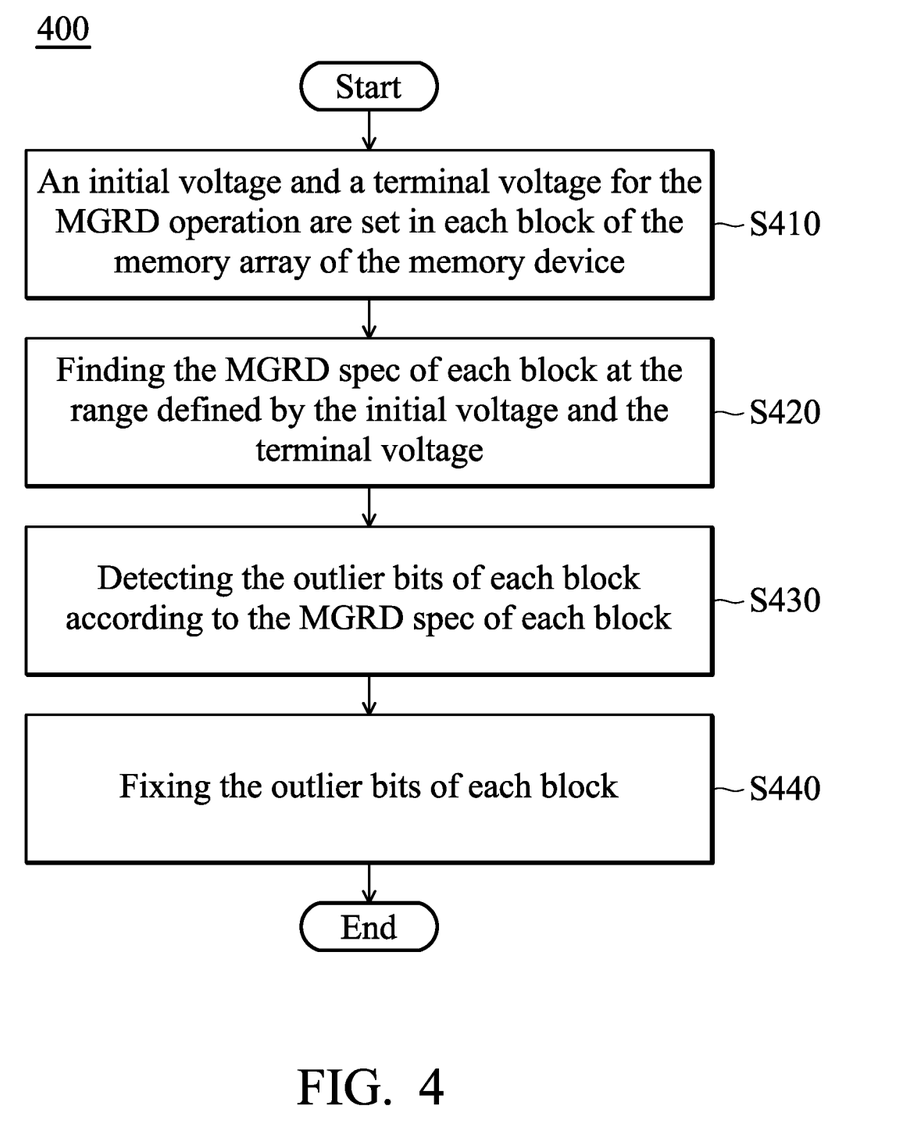
FIG. 4 is a flow chart 400 illustrating the method for fixing the outlier bits according to an embodiment of the invention.

FIG. 4 is a flow chart 400 illustrating the method for fixing the outlier bits according to an embodiment of the invention. The method for fixing the outlier bits is applied to the memory device 100 of the invention. As shown in FIG. 4, in step S410, an initial voltage and a terminal voltage for the MGRD operation are set in each block of the memory array of the memory device 100, wherein the initial voltage is set to a voltage value in a distribution of a threshold voltage corresponding to each block. In step S420, the control circuit of the memory device 100 may find the MGRD spec of each block at the range defined by the initial voltage and the terminal voltage. In step S430, the control circuit of the memory device 100 may detect the outlier bits of each block according to the MGRD spec of each block. In step S440, the control circuit of the memory device 100 may fix the outlier bits of each block.

Figure 5:
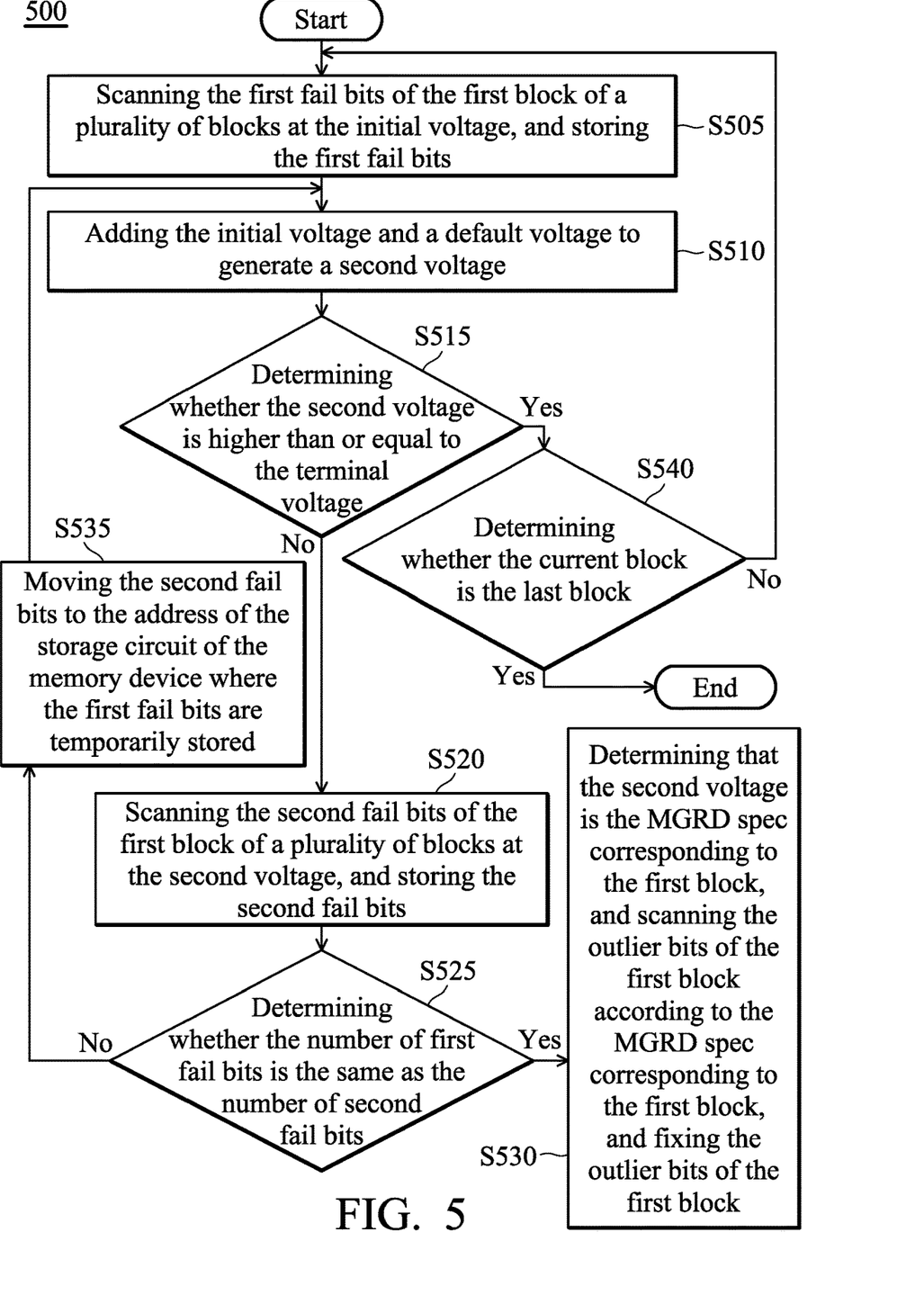
FIG. 5 is a flow chart 500 illustrating the method for fixing the outlier bits in a first state (e.g. an erase state) according to an embodiment of the invention.

FIG. 5 is a flow chart 500 illustrating the method for fixing the outlier bits in a first state (e.g. an erase state) according to an embodiment of the invention. The method for fixing the outlier bits is applied to the memory device 100 of the invention. As shown in FIG. 5, in step S505, the control circuit of the memory device 100 may scan the first fail bits of the first block of a plurality of blocks at the initial voltage, and store the first fail bits in the storage circuit of the memory device 100. In step S510, the control circuit of the memory device 100 may add the initial voltage and a default voltage to generate a second voltage. In step S515, the control circuit of the memory device 100 may determine whether the second voltage is higher than or equal to the terminal voltage.

If the second voltage is lower than the terminal voltage, step S520 is performed. In step S520, the control circuit of the memory device 100 may scan the second fail bits of the first block of a plurality of blocks at the second voltage, and store the second fail bits in the storage circuit of the memory device 100. In step S525, the control circuit of the memory device 100 may determine whether the number of first fail bits is the same as the number of second fail bits. If the number of first fail bits is the same as the number of second fail bits, step S530 is performed. In step S530, the control circuit of the memory device 100 may determine that the second voltage is the MGRD spec corresponding to the first block, and the control circuit of the memory device 100 may scan the outlier bits of the first block according to the MGRD spec corresponding to the first block, and fix the outlier bits of the first block.

If the number of first fail bits is not the same as the number of second fail bits, step S535 is performed. In step S535, the control circuit of the memory device 100 may move the second fail bits to the address of the storage circuit of the memory device 100 where the first fail bits are temporarily stored, and then the control circuit of the memory device 100 may return to step S510 to perform the same processes. That is to say, the control circuit of the memory device 100 may add the second voltage and the default voltage to generate a third voltage accordingly. If the third voltage is lower than the terminal voltage, the control circuit of the memory device 100 may scan the third fail bits of the first block of a plurality of blocks at the third voltage, and store the third fail bits in the storage circuit of the memory device 100. Then, the control circuit of the memory device 100 may determine whether the number of second fail bits is the same as the number of third fail bits.

If the second voltage is higher than or equal to the terminal voltage, step S540 is performed. In step S540, the control circuit of the memory device 100 may determine whether the current block is the last block. If the current block is the last block, the control circuit of the memory device 100 may repeat the processes to find the MGRD spec corresponding to the next block (e.g. a second block). The flow may not be terminated until the control circuit of the memory device 100 has performed the processes for all blocks.

In an embodiment of the invention, after step S520, the control circuit of the memory device 100 may determine whether the number of first fail bits and the number of second fail bits are 0 first. If the number of first fail bits and the number of second fail bits are 0, step S540 is performed. If the number of first fail bits and the number of second fail bits are not 0, step S525 is performed.

Figure 6:
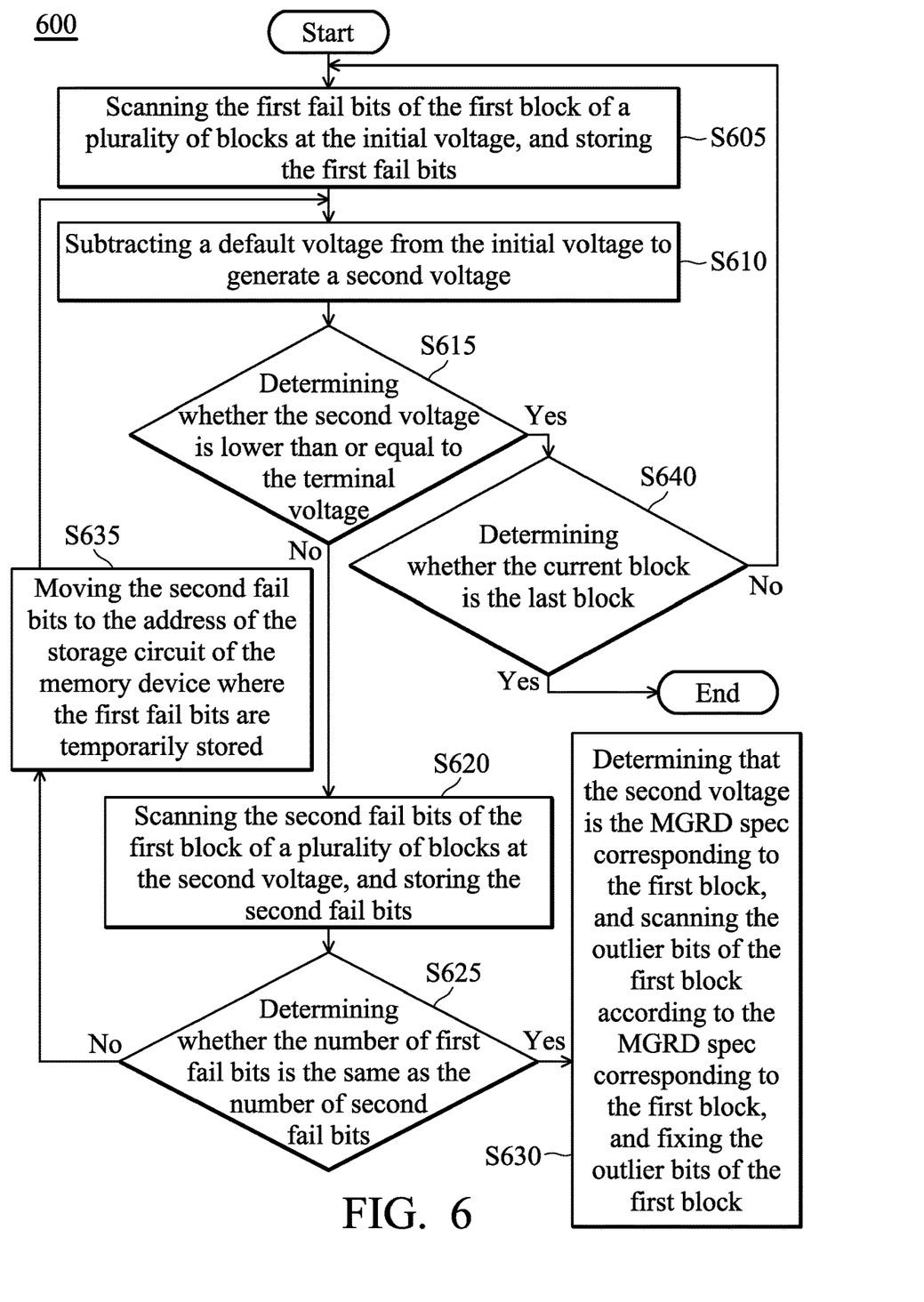
FIG. 6 is a flow chart 600 illustrating the method for fixing the outlier bits in a second state (e.g. a program state) according to an embodiment of the invention.

FIG. 6 is a flow chart 600 illustrating the method for fixing the outlier bits in a first state (e.g. a program state) according to an embodiment of the invention. The method for fixing the outlier bits is applied to the memory device 100 of the invention. As shown in FIG. 6, in step S605, the control circuit of the memory device 100 may scan the first fail bits of the first block of a plurality of blocks at the initial voltage, and store the first fail bits in the storage circuit of the memory device 100. In step S610, the control circuit of the memory device 100 may subtract a default voltage from the initial voltage to generate a second voltage. In step S615, the control circuit of the memory device 100 may determine whether the second voltage is lower than or equal to the terminal voltage.

If the second voltage is higher than the terminal voltage, step S620 is performed. In step S620, the control circuit of the memory device 100 may scan the second fail bits of the first block of a plurality of blocks at the second voltage, and store the second fail bits in the storage circuit of the memory device 100. In step S625, the control circuit of the memory device 100 may determine whether the number of first fail bits is the same as the number of second fail bits. If the number of first fail bits is the same as the number of second fail bits, step S630 is performed. In step S630, the control circuit of the memory device 100 may determine that the second voltage is the MGRD spec corresponding to the first block, and the control circuit of the memory device 100 may scan the outlier bits of the first block according to the MGRD spec corresponding to the first block, and fix the outlier bits of the first block.

If the number of first fail bits is not the same as the number of second fail bits, step S635 is performed. In step S635, the control circuit of the memory device 100 may move the second fail bits to the address of the storage circuit of the memory device 100 where the first fail bits are temporarily stored, and then the control circuit of the memory device 100 may return to step S610 to perform the same processes. That is to say, the control circuit of the memory device 100 may subtract the default voltage from the second voltage to generate a third voltage accordingly. If the third voltage is higher than the terminal voltage, the control circuit of the memory device 100 may scan the third fail bits of the first block of a plurality of blocks at the third voltage, and store the third fail bits in the storage circuit of the memory device 100. Then, the control circuit of the memory device 100 may determine whether the number of second fail bits is the same as the number of third fail bits.

If the second voltage is lower than or equal to the terminal voltage, step S640 is performed. In step S640, the control circuit of the memory device 100 may determine whether the current block is the last block. If the current block is the last block, the control circuit of the memory device 100 may repeat the processes to find the MGRD spec corresponding to the next block (e.g. the second block). The flow may not be terminated until the control circuit of the memory device 100 has performed the processes for all blocks.

In an embodiment of the invention, after step S620, the control circuit of the memory device 100 may determine whether the number of first fail bits and the number of second fail bits are 0 first. If the number of first fail bits and the number of second fail bits are 0, step S640 is performed. If the number of first fail bits and the number of second fail bits are not 0, step S625 is performed.

What is claimed is:

1. A method for fixing outlier bits, applied to a memory device, wherein a memory array of the memory device is divided into a plurality of blocks, and the method comprises:
    setting an initial voltage and a terminal voltage of a margin read (MGRD) operation in each block, wherein the initial voltage is set in a distribution of a threshold voltage of each block;
    finding a MGRD spec corresponding to each block at a range defined by the initial voltage and the terminal voltage;
    detecting outlier bits in each block according to the MGRD spec corresponding to each block; and
    fixing the outlier bits in each block.

2. The method for fixing outlier bits of claim 1, wherein in a first state, the method further comprises:
    detecting first fail bits in a first block of the plurality of blocks at the initial voltage;
    storing the first fail bits;
    detecting second fail bits in the first block at a second voltage, wherein the second voltage is the initial voltage plus a default voltage, and the second voltage is lower than the terminal voltage;
    storing the second fail bits; and
    determining whether the number of first fail bits is the same as the number of second fail bits.

3. The method for fixing outlier bits of claim 2, wherein when the number of first fail bits is the same as the number of second fail bits, the method further comprises:
    determining that the second voltage is the MGRD spec corresponding to the first block; and
    finding the MGRD spec corresponding to a second block of the plurality of blocks; and
    wherein when the number of first fail bits is not the same as the number of second fail bits, the method further comprises:
    detecting third fail bits in the first block at a third voltage, wherein the third voltage is the second voltage plus the default voltage, and the third voltage is lower than the terminal voltage;
    storing the third fail bits; and
    determining whether the number of second fail bits is the same as the number of third fail bits.

4. The method for fixing outlier bits of claim 1, wherein in a second state, the method further comprises:
    detecting first fail bits in a first block of the plurality of blocks at the initial voltage;
    storing the first fail bits;
    detecting second fail bits in the first block at a second voltage, wherein the second voltage is the initial voltage minus a default voltage, and the second voltage is higher than the terminal voltage;
    storing the second fail bits; and
    determining whether the number of first fail bits is the same as the number of second fail bits.

5. The method for fixing outlier bits of claim 4, wherein when the number of first fail bits is the same as the number of second fail bits, the method further comprises:
    determining that the second voltage is the MGRD spec corresponding to the first block; and
    finding the MGRD spec corresponding to a second block of the plurality of blocks; and
    wherein when the number of first fail bits is not the same as the number of second fail bits, the method further comprises:
    detecting third fail bits in the first block at a third voltage, wherein the third voltage is the second voltage minus the default voltage, and the third voltage is higher than the terminal voltage;
    storing the third fail bits; and
    determining whether the number of second fail bits is the same as the number of third fail bits.

6. A memory device, comprising:
    a memory array, comprising a plurality of memory cells and divided into a plurality of blocks, wherein an initial voltage and a terminal voltage of a margin read (MGRD) operation are set in each block, wherein the initial voltage is set in a distribution of a threshold voltage of each block;
    a storage circuit; and a control circuit, coupled to the memory array and the storage circuit, wherein the control circuit finds a MGRD spec corresponding to each block at a range defined by the initial voltage and the terminal voltage, detects outlier bits in each block according to the MGRD spec corresponding to each block, and fixes the outlier bits in each block.

7. The memory device of claim 6, wherein in a first state, the control circuit detects first fail bits in a first block of the plurality of blocks at the initial voltage and stores the first fail bits in the storage circuit, and the control circuit detects second fail bits in the first block at a second voltage and stores the second fail bits, and the control circuit determines whether the number of first fail bits is the same as the number of second fail bits, wherein the second voltage is the initial voltage plus a default voltage, and the second voltage is lower than the terminal voltage.

8. The memory device of claim 7, wherein when the number of first fail bits is the same as the number of second fail bits, the control circuit determines that the second voltage is the MGRD spec corresponding to the first block and finds the MGRD spec corresponding to a second block of the plurality of blocks, and when the number of first fail bits is not the same as the number of second fail bits, the control circuit detects third fail bits in the first block at a third voltage, stores the third fail bits in the storage circuit, and the control circuit determines whether the number of second fail bits is the same as the number of third fail bits, wherein the third voltage is the second voltage plus the default voltage, and the third voltage is lower than the terminal voltage.

9. The memory device of claim 6, wherein in a second state, the control circuit detects first fail bits in a first block of the plurality of blocks at the initial voltage and stores the first fail bits in the storage circuit, and the control circuit detects second fail bits in the first block at a second voltage and stores the second fail bits, and the control circuit determines whether the number of first fail bits is the same as the number of second fail bits, wherein the second voltage is the initial voltage minus a default voltage, and the second voltage is higher than the terminal voltage.

10. The memory device of claim 9, wherein when the number of first fail bits is the same as the number of second fail bits, the control circuit determines the second voltage is the MGRD spec corresponding to the first block and finds the MGRD spec corresponding to a second block of the plurality of blocks, and when the number of first fail bits is not the same as the number of second fail bits, the control circuit detects third fail bits in the first block at a third voltage, stores the third fail bits in the storage circuit, and the control circuit determines whether the number of second fail bits is the same as the number of third fail bits, wherein the third voltage is the second voltage minus the default voltage, and the third voltage is higher than the terminal voltage.

\* \* \* \* \*